US008718305B2

United States Patent
Usher et al.

(10) Patent No.: US 8,718,305 B2
(45) Date of Patent: May 6, 2014

(54) METHOD AND DEVICE FOR BACKGROUND MITIGATION

(75) Inventors: John Usher, Montreal (CA); Marc Andre Boillot, Plantation, FL (US)

(73) Assignee: Personics Holdings, LLC., Boca Raton, FL (US)

( * ) Notice: Subject to any disclaimer, the term of this patent is extended or adjusted under 35 U.S.C. 154(b) by 1365 days.

(21) Appl. No.: 12/165,022

(22) Filed: Jun. 30, 2008

(65) Prior Publication Data

US 2009/0010442 A1  Jan. 8, 2009

Related U.S. Application Data

(60) Provisional application No. 60/946,834, filed on Jun. 28, 2007.

(51) Int. Cl.
*H04R 25/00* (2006.01)

(52) U.S. Cl.
USPC .......................................... 381/318; 381/312

(58) Field of Classification Search
USPC ........ 381/56, 57, 71.1, 71.2, 71.3, 71.4, 71.5, 381/71.6, 71.7, 71.8, 71.9, 312, 317, 318
See application file for complete search history.

(56) References Cited

U.S. PATENT DOCUMENTS

| | | | |
|---|---|---|---|
| 3,987,245 A | 10/1976 | Fasen | |
| 4,837,832 A | 6/1989 | Fanshel | |
| 5,430,826 A | 7/1995 | Webster | |
| 5,867,581 A | 2/1999 | Obara | |
| 6,023,517 A | 2/2000 | Ishige | |
| 6,415,034 B1 * | 7/2002 | Hietanen | 381/71.6 |
| 6,567,524 B1 | 5/2003 | Svean et al. | |
| 6,728,385 B2 | 4/2004 | Kvaloy et al. | |
| 6,754,359 B1 | 6/2004 | Svean et al. | |
| 6,826,515 B2 | 11/2004 | Bernardi | |
| 2001/0046304 A1 | 11/2001 | Rast | |
| 2004/0190729 A1 | 9/2004 | Yonovitz et al. | |
| 2005/0105750 A1 | 5/2005 | Frohlich et al. | |
| 2005/0111683 A1 | 5/2005 | Chabries et al. | |
| 2005/0254665 A1 | 11/2005 | Vaudrey | |
| 2005/0254667 A1 | 11/2005 | Michael | |
| 2006/0045282 A1 | 3/2006 | Reber | |
| 2006/0083388 A1 | 4/2006 | Rothschild | |
| 2006/0262938 A1 * | 11/2006 | Gauger et al. | 381/56 |
| 2007/0129828 A1 | 6/2007 | Lee | |
| 2007/0274531 A1 | 11/2007 | Camp | |
| 2008/0240458 A1 | 10/2008 | Goldstein et al. | |

OTHER PUBLICATIONS

Office Action for U.S. Appl. No. 12/017,878, filed Jan. 22, 2008, mailed Jan. 18, 2012.
Office Action for U.S. Appl. No. 11/966,457, filed Dec. 28, 2007, mailed Aug. 17, 2011.
Office Action for U.S. Appl. No. 12/022,826, filed Jan. 30, 2008, mailed Jul. 13, 2011.

* cited by examiner

*Primary Examiner* — Brian Ensey
(74) *Attorney, Agent, or Firm* — Pablo Meles

(57) ABSTRACT

Methods for audio processing suitable for use with an earpiece are provided. A method includes delivering audio to an ear canal, measuring a residual background noise level within the ear canal, and adjusting the audio based on characteristics of the residual background noise level to maintain a natural audio level. A mixing of an ambient sound signal and an ear canal signal can be used to calculate the residual background noise level. The method can include compensating the residual measurement based on microphone sensitivities.

8 Claims, 7 Drawing Sheets

METHOD AND DEVICE FOR BACKGROUND MITIGATION

CROSS REFERENCE TO RELATED APPLICATIONS

This Application is a Non-Provisional Application of and claims the priority benefit of Provisional Application No. 60/946,834 filed on Jun. 28, 2007, the entire disclosure of which is incorporated herein by reference. This application is also related to U.S. Provisional Application No. 60/885,917 filed on Jan. 22, 2007 entitled "Method and Device for Acute Sound Detection and Reproduction", later converted to a non-provisional application Ser. No. 12/017,878, the entire disclosure of both of which are incorporated herein by reference. This application is also related to U.S. provisional patent application No. 60/887,165 filed on Jan. 30, 2007 entitled "Sound Pressure Level Monitoring and Notification System", later converted to a non-provisional application PERS-0015-US (application Ser. No. 12/022,826), the entire disclosure of both of which are incorporated herein by reference. This application is also related to U.S. Provisional Application No. 60/883,013 filed on Dec. 31, 2006 entitled "Method and Device for Sound Signature Detection", later converted to a non-provisional application with application Ser. No. 11/966,457, the entire disclosure of both of which are incorporated herein by reference.

FIELD

The present invention relates to a device that monitors sound directed to an occluded ear, and more particularly, though not exclusively, to an earpiece and method of operating an earpiece that monitors background noise levels and processes audio.

BACKGROUND

People that use headphones or earpieces generally do so for music enjoyment or voice communication. The user is generally immersed in the audio experience when using such devices. These devices deliver acoustic sound to the ear.

Background noises in the environment can contend with the acoustic sounds produced from these devices. As the background noise levels change, the user may need to adjust the volume to listen to their music over the background noise.

A need therefore exists for improving the sound delivery experience of headphones or earpieces.

SUMMARY

Embodiments in accordance with the present invention provide a method and device for background noise mitigation.

In a first embodiment, an earpiece can include an Ambient Sound Microphone (ASM) configured to measure a background noise level, an Ear Canal Receiver (ECR) configured to deliver audio content to an ear canal, and a processor operatively coupled to the ASM and the ECR. The processor can be configured to maintain an approximately constant ratio between an audio content level (ACL) of the audio content and a residual background noise level within the ear canal based on characteristics of the background noise level.

The processor can subtract an attenuation level or noise reduction rating of the earpiece from an ambient sound level of the ambient sound to estimate the residual background noise level within the ear canal. The processor can regulate ambient sound from the ASM to the ECR to maintain the approximately constant ratio. The sound produced within the ear canal upon mitigation of the background noise can be approximately the same frequency representation as the ambient sound. The processor can select a compression based on an amplitude level and a frequency content of the residual background noise. The processor can adjust sound levels in the ear canal to maintain the constant signal-to-noise ratio using the compression.

The earpiece can further comprise an ear Canal Microphone (ECM) configured to measure directly the residual background noise level within the ear canal. The processor upon detecting sound activity within the ear canal via the ECM, can update the residual background noise level to compensate for a sound level or the sound activity. The sound activity can include voice activity or audio content activity such as music.

In a second exemplary embodiment, an earpiece can include an Ambient Sound Microphone (ASM) configured to measure a background noise signal, an Ear Canal Receiver (ECR) configured to deliver audio to an ear canal, an Ear Canal Microphone (ECM) configured to convert an internal sound within an ear canal of a user to an internal sound signal, and a processor operatively coupled to the ASM, the ECR and the ECM. The processor can be configured to maintain a natural audio level based on a combined measurement of the background noise signal and the internal sound signal.

In one arrangement, the processor can estimate the residual background noise signal within the ear canal by subtracting an estimated audio content sound level (ACL) from the background noise signal. In another arrangement, the processor can estimate the residual background noise signal within the ear canal by subtracting a noise reduction rating from the background noise signal. The earpiece can estimate a sensitivity of the ASM and the ECM, and update the residual background noise signal based on characteristics of the sensitivity.

In a third exemplary embodiment, a method for audio processing suitable for use with an earpiece can include the steps of delivering audio to an ear canal, measuring a residual background noise level within the ear canal, and adjusting the audio based on characteristics of the residual background noise level to maintain a natural audio level. The method can include monitoring background noise levels external to the ear canal, and estimating the residual background noise level by subtracting an estimated audio content sound level (ACL) from the background noise level. The residual background noise level can be measured within the ear canal, and the background noise level can be measured external to the ear canal. A mixing of an ambient sound signal and an ear canal signal and be calculated, and the residual background noise level can be calculated based on the mixing.

The method can include subtracting an estimated audio content sound level (ACL) from the background noise level when an ambient sound microphone is used to measure the background noise, and/or subtracting a noise reduction rating from the background noise level when an ear canal microphone is used to measure the background noise. The method can include determining a sensitivity of an ambient sound microphone and an ear canal microphone, and updating the residual background noise level based on characteristics of the sensitivity.

As part of the method, an audio level of audio presented to the ear canal can be adjusted to maintain an approximately constant signal to noise ratio of the audio content level to the residual background noise level within the ear canal. A delivery of ambient sound to the ear canal can be regulated to maintain an approximately constant signal to noise ratio of the audio content level to the residual background noise level within the ear canal.

The method can further include selecting a compression based on an amplitude level and a frequency content of the residual background noise, and adjusting an audio level of the audio in the ear canal to maintain a constant signal to noise ratio using the compression. The compression can be characterized by a compression curve with a knee that is a function of the residual background noise. In one arrangement, the knee can correspond to a gate level of the audio content level.

DETAILED DESCRIPTION

Figure 1:
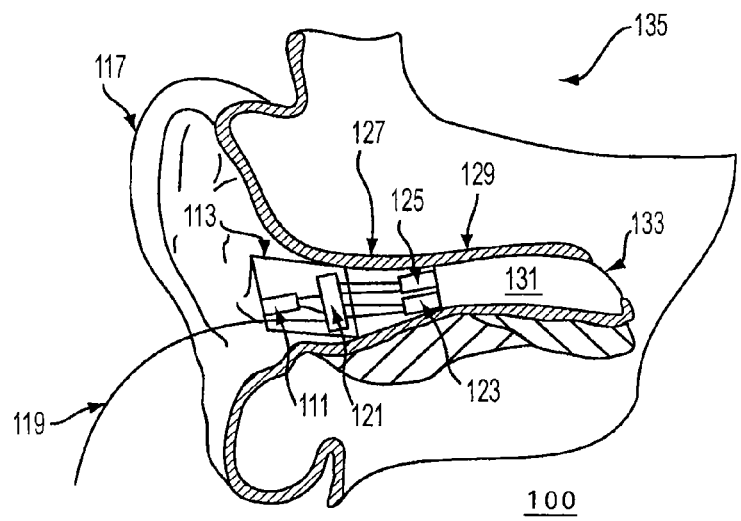
FIG. 1 is a pictorial diagram of an earpiece in accordance with an exemplary embodiment.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication and use of transducers. Additionally in at least one exemplary embodiment the sampling rate of the transducers can be varied to pick up pulses of sound, for example less than 50 milliseconds.

In all of the examples illustrated and discussed herein, any specific values, for example the sound pressure level change, should be interpreted to be illustrative only and non-limiting. Thus, other examples of the exemplary embodiments could have different values.

Note that similar reference numerals and letters refer to similar items in the following figures, and thus once an item is defined in one figure, it may not be discussed for following figures.

Note that herein when referring to correcting or preventing an error or damage (e.g., hearing damage), a reduction of the damage or error and/or a correction of the damage or error are intended.

Broadly stated, exemplary embodiments herein are directed to an earpiece and method for audio processing suitable for use with the earpiece that comprises delivering audio to an ear canal, measuring a residual background noise level within the ear canal, and adjusting the audio based on characteristics of the residual background noise level (e.g., the sound pressure level of the background noise level) to maintain a natural audio level. In one aspect, a natural audio level preserves an original volume to background noise level established by the user as originally selected by the user. In another aspect, a natural audio level preserves the fidelity and spectral content of the audio as originally selected by the user (e.g., graphic equalization) in a particular environment or context. For instance, as background noise levels change while a user is listening to music, the residual sounds in the ear canal change; the earpiece automatically adjusts the volume level to a preferred setting to maintain a natural music signal level to residual background noise level within the ear canal. In one case, the preferred setting can be automatically set when the user makes the music selection and adapted thereafter.

At least one exemplary embodiment of the invention is directed to an earpiece for background noise mitigation. Reference is made to FIG. 1 in which an earpiece device, generally indicated as earpiece 100, is constructed in accordance with at least one exemplary embodiment of the invention. As illustrated, earpiece 100 depicts an electro-acoustical assembly 113 (also referred to herein as assembly 113) for an in-the-ear (in-ear) acoustic assembly, as it would typically be placed in the ear canal 131 of a user 135. The earpiece 100 can be an in the ear earpiece, behind the ear earpiece, receiver in the ear, open-fit device, or any other suitable earpiece type. The earpiece 100 can be partially or fully occluded in the ear canal, and is suitable for use with users having healthy or abnormal auditory functioning.

Earpiece 100 includes an Ambient Sound Microphone (ASM) 111 to capture ambient sound, an Ear Canal Receiver (ECR) 125 to deliver audio to an ear canal 131, and an Ear Canal Microphone (ECM) 123 to capture internal sounds within the ear canal and also assess a sound exposure level within the ear canal. The earpiece 100 can partially or fully occlude the ear canal 131 to provide various degrees of acoustic isolation. The assembly is designed to be inserted into the user's ear canal 131, and to form an acoustic seal with the walls 129 of the ear canal at a location 127 between the entrance 117 to the ear canal 131 and the tympanic membrane (or eardrum) 133. Such a seal is typically achieved by means of a soft and compliant housing of assembly 113. Such a seal is pertinent to the performance of the system in that it creates a closed cavity of ear canal 131 (also referred to herein as closed cavity 131 or ear canal cavity 131) of approximately 5 cc between the in-ear assembly 113 and the tympanic membrane 133. As a result of this seal, the ECR (speaker) 125 is able to generate a full range bass response when reproducing sounds for the user. This seal also serves to significantly reduce the sound pressure level at the user's eardrum 133 resulting from the sound field at the entrance to the ear canal 131. This seal is also the basis for the sound isolating performance of the electro-acoustical assembly 113.

Located adjacent to the ECR 125, is the ECM 123, which is acoustically coupled to the (closed) ear canal cavity 131. One of its functions is that of measuring the sound pressure level in the ear canal cavity 131 as a part of testing the hearing acuity of the user as well as confirming the integrity of the acoustic seal and the working condition of itself and the ECR 125. The ECM 123 can also be used for capturing voice that is resonant within the ear canal when the user is speaking to permit voice communication.

The ASM 111 is housed in an assembly 113 and monitors sound pressure at the entrance to the occluded or partially occluded ear canal. The ASM 111 can also be used to capture the user's voice externally for permitting voice communication. All transducers shown can receive or transmit audio signals to a processor 121 that undertakes audio signal processing and provides a transceiver for audio or voice via the wired or wireless communication path 119.

The earpiece 100 can actively monitor a sound pressure level both inside and outside an ear canal and enhance spatial and timbral sound quality while maintaining supervision to ensure safes sound reproduction levels. The earpiece 100 in various exemplary embodiments can conduct listening tests, filter sounds in the environment, monitor warning sounds in the environment, present notification based on identified warning sounds, maintain constant audio content to ambient sound levels, and filter sound in accordance with a Personalized Hearing Level (PHL).

Figure 2:
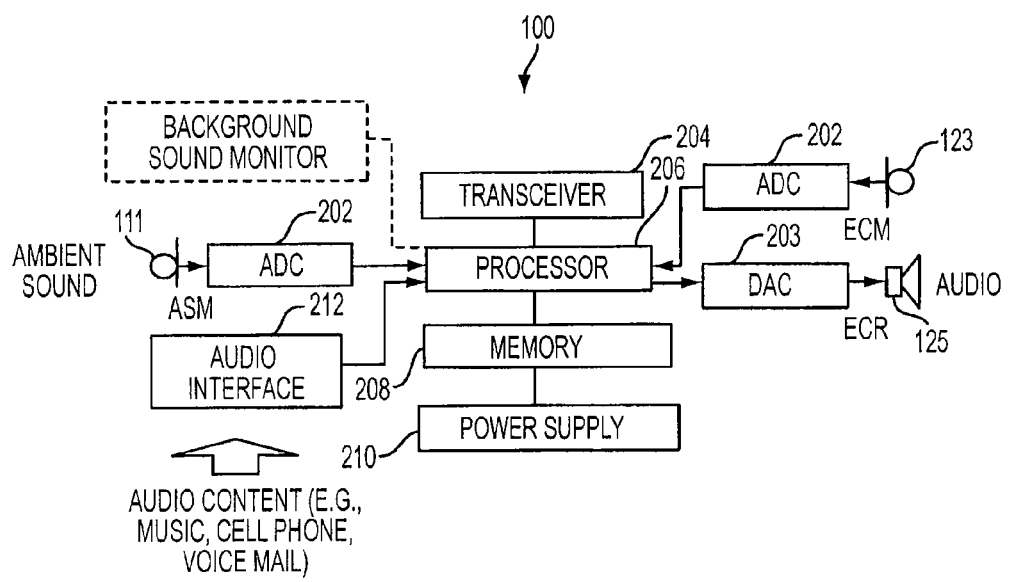
FIG. 2 is a block diagram of the earpiece in accordance with an exemplary embodiment.

Referring to FIG. 2, a block diagram of the earpiece 100 in accordance with an exemplary embodiment is shown. As illustrated, the earpiece 100 can include a processor 206 operatively coupled to the ASM 111, ECR 125, and ECM 123 via one or more Analog to Digital Converters (ADC) 202 and Digital to Analog Converters (DAC) 203. The processor 206 can measure ambient sounds in the environment received at the ASM 111 and internal sounds captured at the ECM 123. Ambient sounds correspond to sounds within the environment such as the sound of traffic noise, street noise, conversation babble, or any other acoustic sound.

Ambient sounds can also correspond to industrial sounds present in an industrial setting, such as, factory noise, lifting vehicles, automobiles, and robots. Internal sounds can correspond to sound contained within the ear canal 131 such as spoken voice or audio content delivered by way of the ECR 125. The internal sounds can also include residual background noise related to ambient sounds in the environment; for example, high level sounds that leak around the ear seal at location 127 and enter the ear canal 131. The processor 206 can monitor the ambient sound captured by the ASM 111 for sounds in the environment, such as an abrupt high energy sound corresponding to an on-set of a warning sound (e.g., bell, emergency vehicle, security system, etc.), siren (e.g., police car, ambulance, etc.), voice (e.g., "help", "stop", "police", etc.), or specific noise type (e.g., breaking glass, gunshot, etc.).

The processor 206 can utilize computing technologies such as a microprocessor, Application Specific Integrated Chip (ASIC), and/or digital signal processor (DSP) with associated storage memory 208 such as Flash, ROM, RAM, SRAM, DRAM or other like technologies for controlling operations of the earpiece device 100. The memory 208 can store program instructions for execution on the processor 206 as well as captured audio processing data.

The memory 208 can also store program instructions for execution on the processor 206 as well as captured audio processing data and filter coefficient data. The memory 208 can be off-chip and external to the processor 206, and include a data buffer to temporarily capture the ambient sound and the internal sound, and a storage memory to save from the data buffer the recent portion of the history in a compressed format responsive to a directive by the processor 206. The data buffer can be a circular buffer that temporarily stores audio sound at a current time point to a previous time point. It should also be noted that the data buffer can in one configuration reside on the processor 206 to provide high speed data access. The storage memory 208 can be non-volatile memory such as SRAM to store captured or compressed audio data.

The earpiece 100 can include an audio interface 212 operatively coupled to the processor 206 to receive audio content, for example from a media player or cell phone, and deliver the audio content to the processor 206. The processor 206 responsive to detecting acute sounds can adjust the audio content and pass the acute sounds directly to the ear canal. For instance, the processor can lower a volume of the audio content responsive to detecting an acute sound for transmitting the acute sound to the ear canal. The processor 206 can also actively monitor the sound exposure level inside the ear canal and adjust the audio to within a safe and subjectively optimized listening level range.

The earpiece 100 can further include a transceiver 204 that can support singly or in combination any number of wireless access technologies including without limitation Bluetooth™, Wireless Fidelity (WiFi), Worldwide Interoperability for Microwave Access (WiMAX), and/or other short or long range communication protocols. The transceiver 204 can also provide support for dynamic downloading over-the-air to the earpiece 100. It should be noted also that next generation access technologies can also be applied to the present disclosure.

The power supply 210 can utilize common power management technologies such as replaceable batteries, supply regulation technologies, and charging system technologies for supplying energy to the components of the earpiece 100 and to facilitate portable applications. A motor (not shown) can be a single supply motor driver coupled to the power supply 210 to improve sensory input via haptic vibration. As an example, the processor 206 can direct the motor to vibrate responsive to an action, such as a detection of a warning sound or an incoming voice call.

The earpiece 100 can further represent a single operational device or a family of devices configured in a master-slave arrangement, for example, a mobile device and an earpiece. In the latter exemplary embodiment, the components of the earpiece 100 can be reused in different form factors for the master and slave devices.

Figure 3:
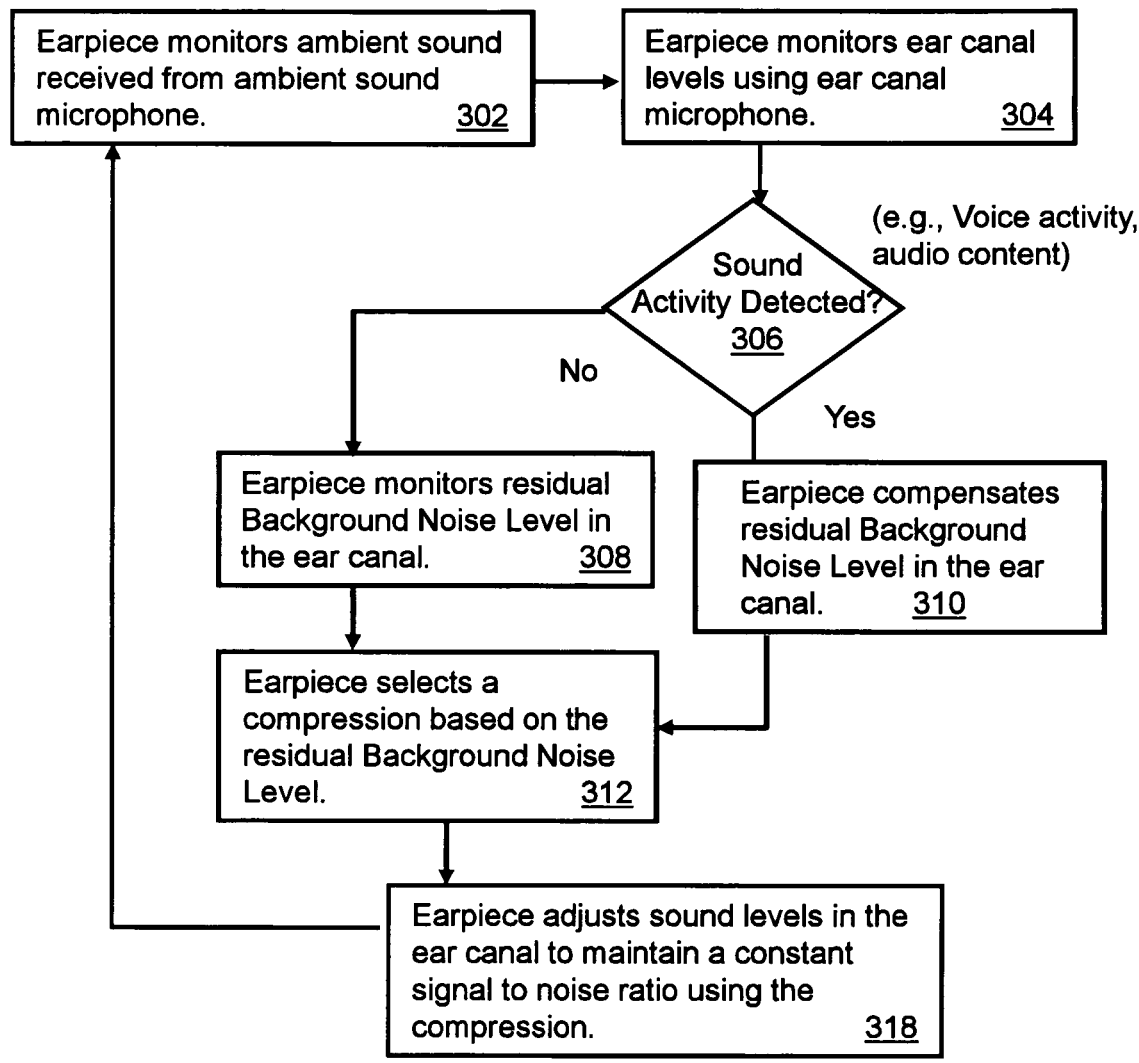
FIG. 3 is a flowchart of a method for audio processing based on residual background noise signals suitable for use with an earpiece in accordance with an exemplary embodiment.

FIG. 3 is a flowchart of a method 300 for background noise mitigation in accordance with an exemplary embodiment. The method 300 can be practiced with more or less than the number of steps shown and is not limited to the order shown. To describe the method 300, reference will be made to components of FIG. 2, although it is understood that the method 300 can be implemented in any other manner using other suitable components. The method 300 can be implemented in a single earpiece, a pair of earpieces, headphones, or other suitable headset audio delivery devices.

The method 300 can start in a state wherein the earpiece 100 has been inserted and powered on. As shown in step 302, the earpiece 100 can monitor the environment for ambient sounds received at the ASM 111. Ambient sounds correspond to sounds within the environment such as the sound of traffic noise, street noise, conversation babble, or any other acoustic sound. Ambient sounds can also correspond to industrial sounds present in an industrial setting, such as factory noise, lifting vehicles, automobiles, and robots to name a few.

Although the earpiece 100 when inserted in the ear can partially occlude the ear canal, the earpiece 100 may not completely attenuate the ambient sound. During the monitoring of ambient sounds in the environment, the earpiece 100 also monitors ear canal levels via the ECM 123 as shown in step 304. The passive aspect of the physical earpiece 100, due to the mechanical and sealing properties, can provide upwards of a 22-26+dB noise reduction. However, portions of ambient sounds higher than 26 dB may still pass through the earpiece 100 into the ear canal generating residual sound in the ear canal.

At step 306, a determination of whether sound activity is detected can be made. Sound activity can correspond to audio content (e.g., music, voice mail, voice), and/or spoken voice (i.e., when the user of the earpiece 100 is speaking). Sound within the ear canal 131 can also be provided via the audio interface 212. The audio interface 212 can receive the audio content from at least one among a portable music player, a cell phone, and a portable communication device. The audio interface 212 responsive to user input can direct sound to the ECR 125. For instance, a user can elect to play music through the earpiece 100 which can be audibly presented to the ear canal 131 for listening. The user can also elect to receive voice communications (e.g., cell phone, voice mail, messaging) via the earpiece 100. For instance, the user can receive audio content for voice mail or a phone call directed to the ear canal via the ECR 125.

If at step 306, sound activity (e.g., music, cell phone, spoken voice) is not detected, the earpiece 100 monitors residual background noise level in the ear canal at step 308. Residual background noise is resident in the ear canal and can be heard by the user. The residual background noise (sound) can be a residue of the background sounds in the ambient environment that are not completely attenuated by the earpiece 100. For example, a loud explosion, car horn, siren, snoring, or crash sound in the environment may pass through (passively) the earpiece 100 as residual sound and be heard by the user wearing the earpiece. The processor 206 by way of the ECM 123 can monitor the ear canal for residual background noises corresponding to ambient background noises in the environment.

The processor 206 can distinguish residual background noise from sound activity such as audio content by way of configuration logic. For instance, in the case of detecting audio content, the processor 206 is aware whether it is delivering audio content to the ECR 125. The control logic establishes whether the processor 206 is actively playing sound (e.g., music), or actively receiving a phone call, for example, from audio data and/or information that is provided from the audio interface 212. Configuration logic does not include analyzing acoustic sound waves within the ear canal to discriminate among differing sound patterns.

The processor 206 can however discriminate between spoken voice (when the user is speaking) and residual background noise based on characteristics of the user's voice, such as, level, frequency, and duration. For instance, upon detecting periods of up and down energy fluctuations within certain time interval durations and within certain frequency ranges, the processor 206 can flag a presence of voice-speech is characterized by periods of energy fluctuations over time (e.g. words or phrases). The processor 206 can also include voice activity detection logic to assess whether internal sounds captured in the ear canal have characteristics (e.g., level, pitch, energy, onset, etc) that correspond to spoken voice for detecting sound activity. This permits the processor 206 to discriminate between spoken voice and residual background noises in the ear canal.

If at step 306 sound activity is detected, the earpiece compensates the residual background noise level in the ear canal at step 310. For instance, as discussed ahead, the earpiece can account for an audio content level or a noise reduction rating of the earpiece 100. In one case, the processor 206 can estimate (or update) the residual background noise signal within the ear canal by subtracting an estimated audio content sound level (ACL) from the background noise signal. Alternatively, or in combination, the processor 206 can estimate (or update) the residual background noise signal within the ear canal by subtracting a noise reduction rating from the background noise signal.

Figure 8:
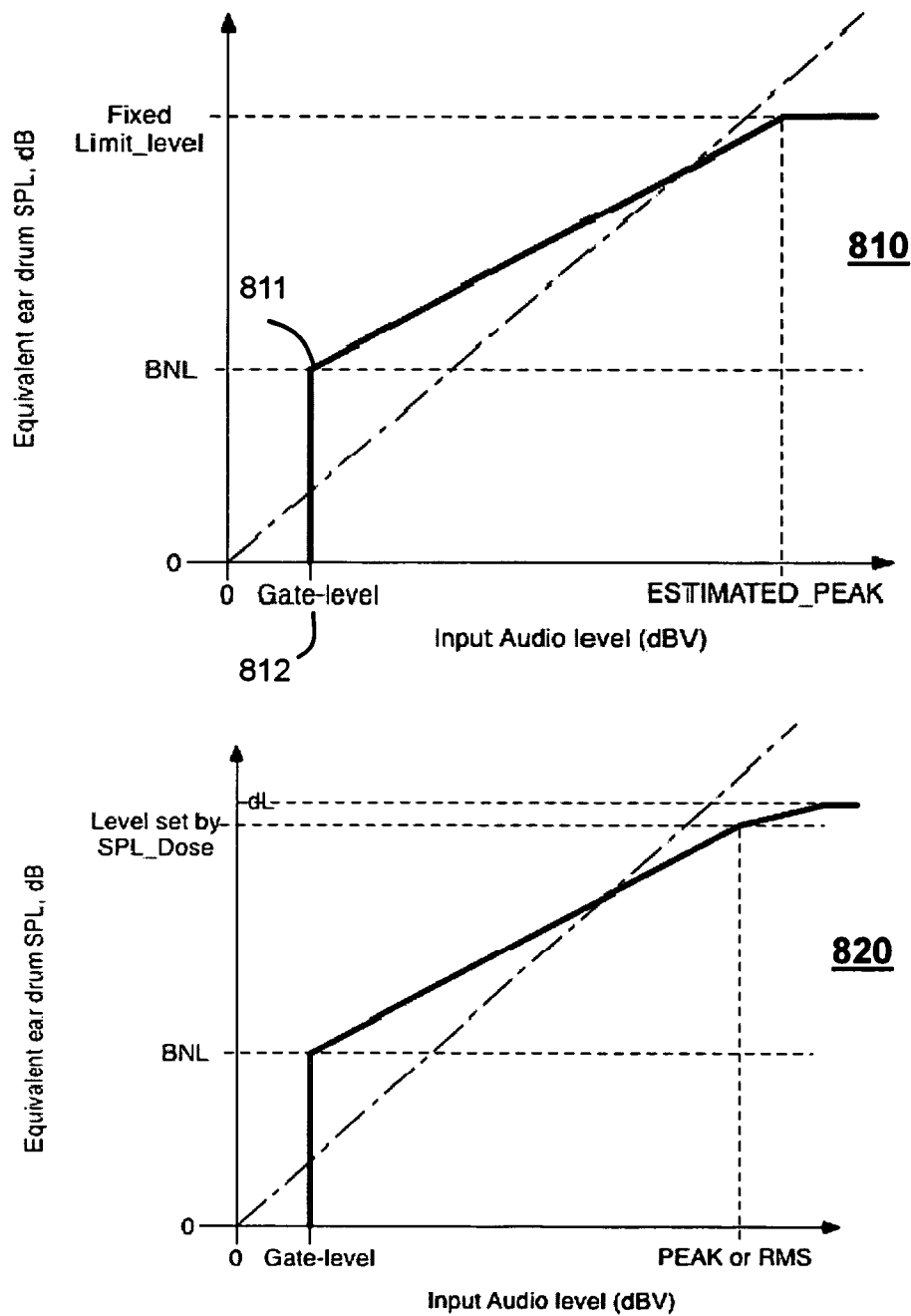
FIG. 8 is a plot of compression curves in accordance with an exemplary embodiment.

At step 312, the earpiece 100 selects a compression based on the residual background noise level. The compression can be a time domain or a frequency domain transformation that is applied to the audio content to amplify or attenuate portions of the audio content waveforms. FIG. 8 illustrates a first compression curve 810 and a second compression curve 820 that are a function of the residual background noise level. More specifically, the compression is characterized by a compression curve with a knee 811 that is a function of the residual background noise level (BNL). The knee 811 can correspond to a gate level 812 of the audio content level.

Returning back to FIG. 3, the earpiece 100 upon selecting a compression adjusts sound levels in the ear canal to maintain a constant signal to noise ratio as shown in step 318. The processor 206 can thus, in determination of the residual background noise measured within the ear canal, mitigate the effects of the background noise by adjusting the volume level and frequency response of the audio content delivered to the ear canal. Alternatively, or in combination, the processor 206 can also regulate the throughput of ambient sound from the ASM 111 to the ECM 123 to maintain a constant signal to noise ratio.

The method 300 can continue back to step 302 and 304 to monitor ambient sounds in the environment and residual background noise levels in the ear canal, respectively.

Figure 4:
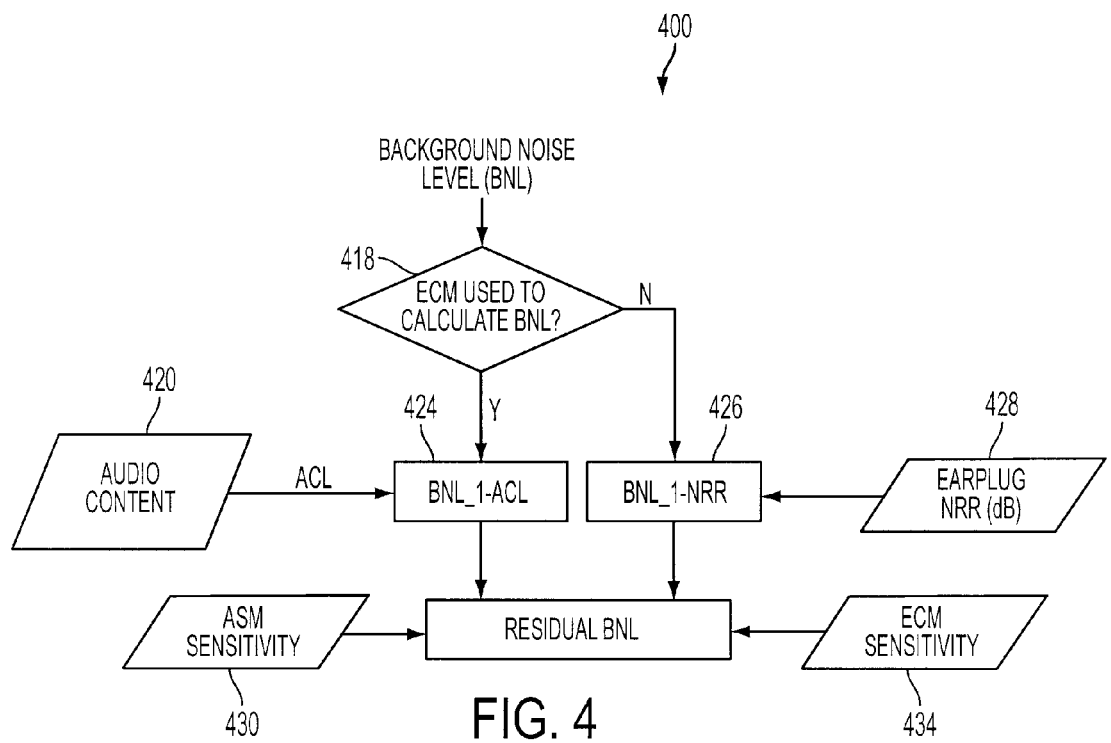
FIG. 4 is a flowchart for estimating residual background noise levels from a combination of measurements at an ambient sound microphone and an ear-canal microphone in accordance with an exemplary embodiment.

FIG. 4 is a flowchart of a method 400 for compensating the residual background noise level. The method 400 relates to method step 310 of FIG. 3 for compensating the residual background noise level based on a determination of sound activity. The method 400 can be practiced with more or less than the number of steps shown and is not limited to the order shown.

Briefly, method 400 receives as input a background noise estimate from the ambient sound signal from ASM 111 and/or the internal sound signal from the ECM 123. The method 400 updates the residual background noise level depending on which microphone (ASM or ECM) is used to measure the residual noise. This is done to compensate for differences in location, sensitivity, and configuration of the earpiece 100 operating modes and component configurations (e.g., ASM 111, ECM 123, ECR 125).

If at step 418, it is determined that the ECM 123 was used to calculate the Background Noise Level (BNL), the processor 206 at step 424 subtracts off an audio content level (ACL) of the audio content 420 to update the residual background noise level measured within the ear canal. (Subtracts refers to removing the contribution, though the operation may be a multiplication or division operation; sound levels can be expressed as SPL ratios (division) which in dB is a subtraction.) Recall, that the audio interface 212 can deliver music to the processor 206 and that music is played out the ECR 125. The processor 206 at step 424 accounts for the level of the audio content when assessing the residual background noise levels when sound activity is detected by removing the audio content level (see FIG. 3).

In one arrangement, the processor 206 can apply an ear-canal transfer function to the audio content delivered to the ECR 125 to obtain an estimate of the audio content level. Moreover, the processor in periods of non-spoken activity can update the transfer function to improve the estimate of the transfer function. Upon estimating the audio content level, the processor can update the residual background noise levels by subtracting off the estimated audio content level. In this manner, the ECM 123 can be used alone to provide an estimate of the residual background noise within the ear canal.

If at step 418 it is however determined that the ASM 111 was used to calculate the background noise level, the processor 206 at step 426 subtracts a noise reduction rating (NRR) 428 from the background noise level to estimate the residual background noise level within the ear canal. Recall, the sealing aspect of the earpiece 100 provides a degree of acoustic isolation expressed as a noise reduction rating (NRR). In this manner, the processor can monitor the ASM 111 to provide an estimate of the residual background noise within the ear canal.

As shown in steps 430 and 434, the ASM sensitivity and ECM sensitivity can be respectively taken into account when calculating the residual background noise level. The ASM and ECM sensitivity can be measured through scheduled or random calibration tests administered by the earpiece 100. For instance, to evaluate the ECM sensitivity, the processor 206 can direct the ECR 125 to emit a conditioned test tone and simultaneously listen to the generated test tone via the ECM 123. The processor 206 can compare the frequency response of the captured test tone with a calibrated frequency response to determine any offset in sensitivity. When the earpiece is removed from the ear, the processor, upon detection by the earpiece 100 or from manual intervention, can direct the ECR 125 to emit a conditioned test tone and simultaneously listen to the generated test tone via the ASM 111. The earpiece 100 is removed to permit passage of sound from the ECR 125 to the ASM 111 as shown in FIG. 1. Similarly, the processor can compare the frequency response of the captured test tone with a calibrated frequency response to determine any offset in sensitivity.

The residual background noise resident in the ear canal can also be estimated from a combination of the ASM 111 and ECM 123 measurements. Accordingly, the method 400 can further include determining a mixing of an ambient sound signal and the internal (e.g. ear canal) signal, and calculating the residual background noise level based on the mixing. Upon determining the compensation levels, the method 400 can proceed to determine compression curves (see FIG. 8) based on characteristics of the residual background noise level. The compression curves (810 and 820) can be implemented by various types of filters (FIR, IIR, parametric, biquad, etc.) Upon selecting a compression, the earpiece 100 adjusts an audio level of audio presented to the ear canal to maintain an approximately constant signal to noise ratio of the audio content level to the residual background noise level within the ear canal.

Figure 5:
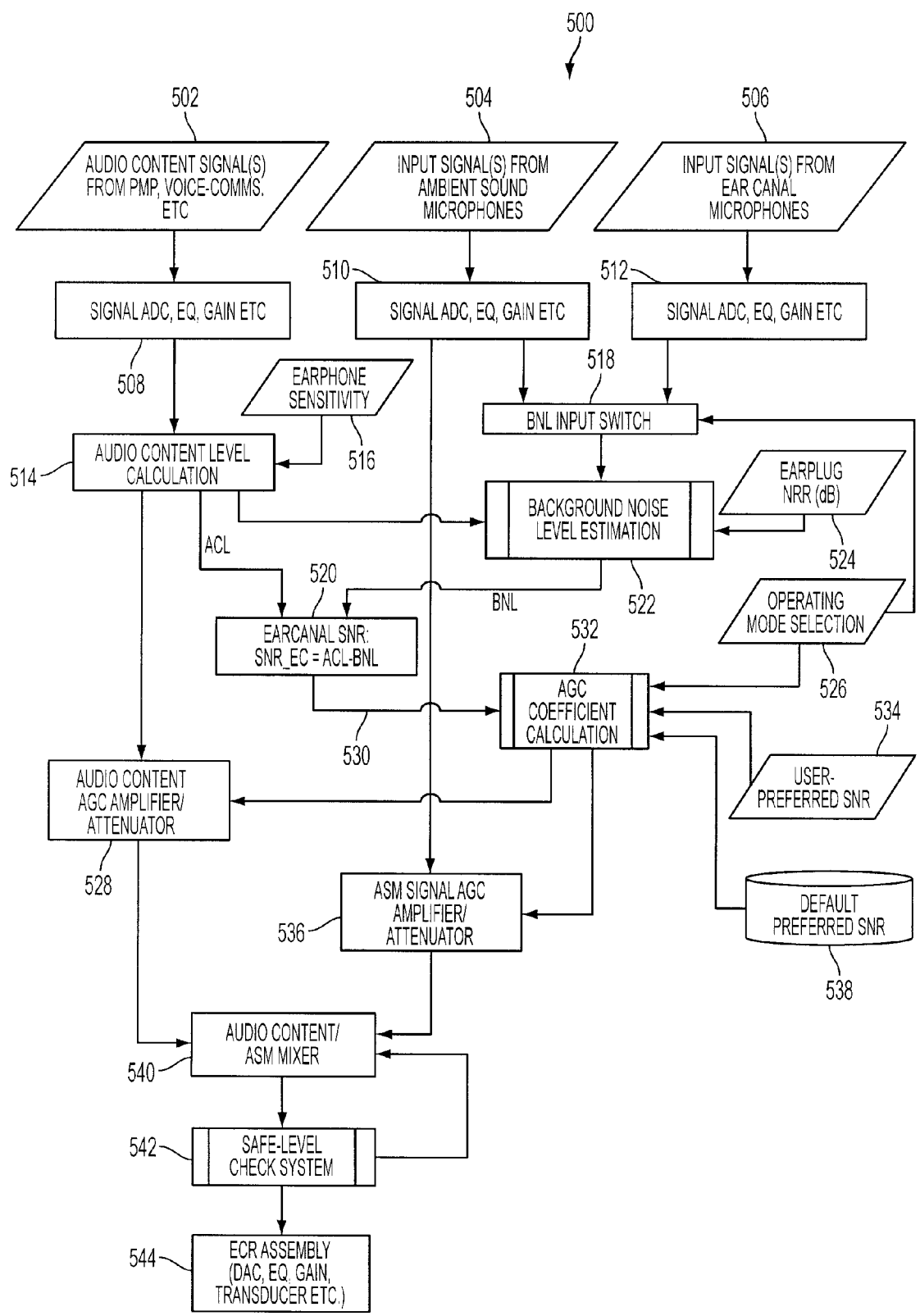
FIG. 5 is a flowchart of a method for background noise mitigation in accordance with an exemplary embodiment.

FIG. 5 is a flowchart of a method 500 for maintaining constant audio content level (ACL) to residual background noise level (BNL). The method 500 can be practiced with more or less than the number of steps shown and is not limited to the order shown. To describe the method 500, reference will be made to components of FIG. 2, although it is understood that the method 500 can be implemented in any other manner using other suitable components. The method 500 can be implemented in a single earpiece, a pair of earpieces, headphones, or other suitable headset audio delivery devices.

Briefly, FIG. 5 describes a method 500 for Constant Signal-to-Noise Ratio (CSNRS) based on measured residual background noise within the ear canal. At step 504 an input signal is captured from the ASM 111 and processed at step 510 (e.g. ADC, EQ, gain). Similarly, at step 506 an input signal from the ECM 123 is captured and processed at step 512. The method 500 also receives as input an Audio Content signal 502, e.g. a music audio signal from a portable Media Player or mobile-phone, which is processed with analog and digital signal processing as shown in step 508. An Audio Content Level (ACL) is determined at step 514 that incorporates at step 516 an earpiece (earphone) sensitivity, and returns a dBV value.

In at least one exemplary embodiment, method 500 calculates a RMS value over a window (e.g. the last 100 ms). The RMS value can be first weighted with a first weighting coefficient and then averaged with a weighted previous level estimate. The ACL is converted to an equivalent SPL value (ACL), which can use either a look-up-table or algorithm to calculate the ear-canal SPL of the signal if it was reproduced with the ECR 125. To calculate the equivalent ear canal SPL, the sensitivity of the ear canal receiver can be factored in during processing.

At step 522 the BNL is estimated using inputs from either or both the ASM signal at step 504, and/or the ECM signal at step 506. These signals are selected using the BNL input switch at step 518, which may be controlled automatically or with a specific user-generated manual operation at step 526. The earpiece 100 noise reduction rating (NRR) can also be taken into account at step 524 when estimating the BNL, for example, by subtracting the dB value of the NRR from the BNL. The Ear-Canal SNR is calculated at step 520 by differencing the ACL from step 514 and the BNL from step 522 and the resulting SNR 530 is passed to the method step 532 for AGC coefficient calculation. The AGC coefficient calculation calculates gains for the Audio Content signal and ASM signal from the Automatic Gain Control steps 528 and 536 (for the Audio Content and ASM signals, respectively). A user preferred SNR can also be taken into account when calculating the AGC coefficients as illustrated by step 534. Alternatively a default preferred SNR can be used instead at step 538. After the ASM signal and Audio content signal have been processed by the AGC's 528 and 536, the two signals are mixed at step 540.

At step 542, a safe-level check determines if the resulting mixed signal is too high in level, if it were reproduced with the ECR 125 as shown in block 544. The safe-level check can use information regarding the user's listening history to determine if the user's sound exposure is such that it may cause temporary or permanent hearing threshold shift. If such high levels are measured, then the safe-level check reduces the signal level of the mixed signals via a feedback path to step 540. The resulting audio signal generated after step 542 is then reproduced with the ECR 125.

Figure 6:
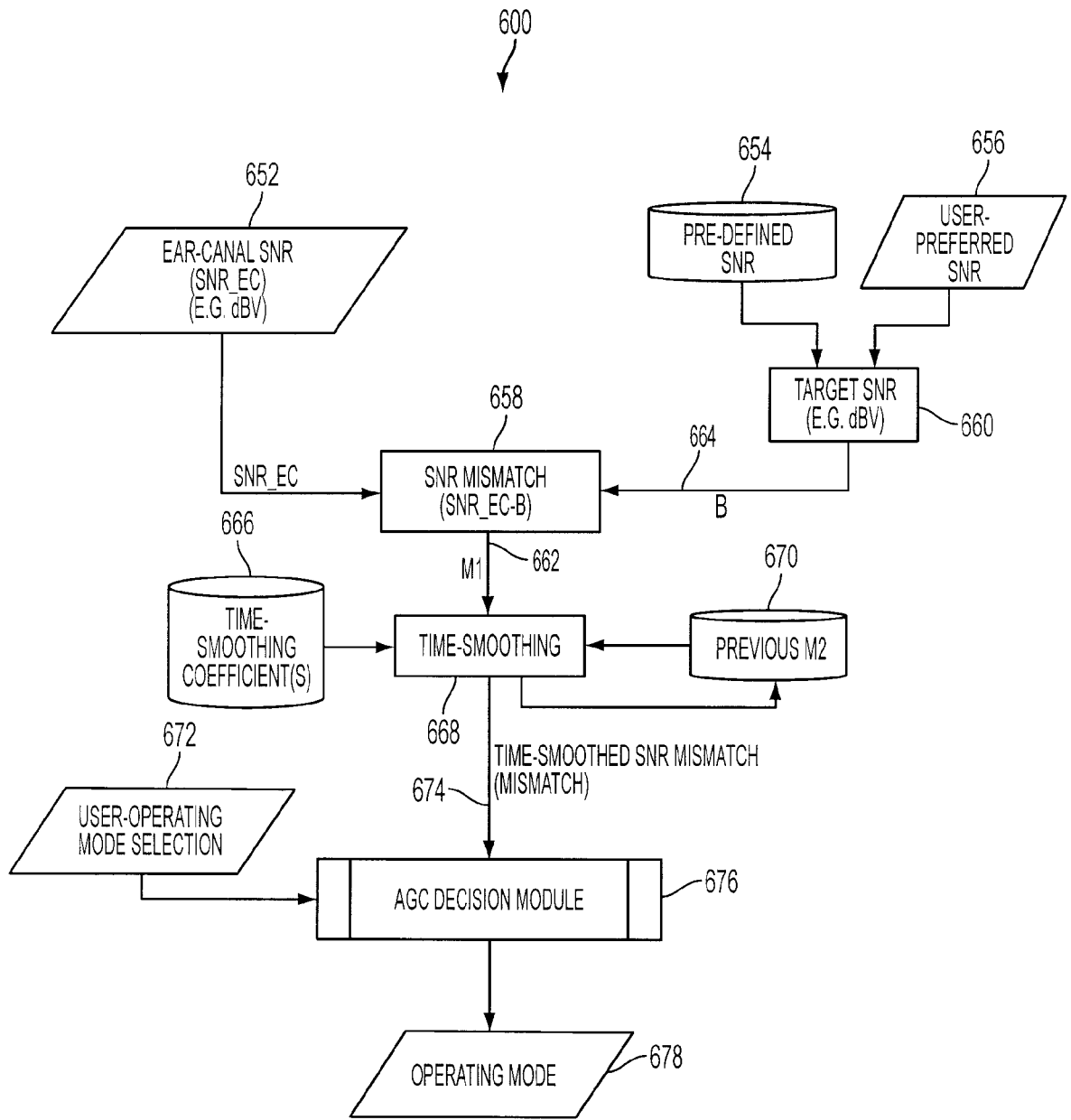
FIG. 6 is a flowchart of a method for maintaining constant audio content level (ACL) residual background noise level in accordance with an exemplary embodiment.

FIG. 6 is a flowchart of a method 600 for maintaining constant signal to noise ratio based on automatic gain control (AGC). The method 600 can be practiced with more or less than the number of steps shown and is not limited to the order shown. To describe the method 600, reference will be made to components of FIG. 2, although it is understood that the method 600 can be implemented in any other manner using other suitable components. The method 600 can be implemented in a single earpiece, a pair of earpieces, headphones, or other suitable headset audio delivery devices.

Method 600 describes calculation of AGC coefficients. The method 600 receives as its inputs an Ear Canal SNR 652 and a target SNR 660 to provide a SNR mismatch 658. The target SNR is chosen from a pre-defined SNR 654, sorted in computer memory or a manually defined SNR 656. At step 658, a difference is calculated between the actual ear-canal SNR (SNR-EC) and the target SNR (B) 664 to produce the mismatch 662. The mismatch level 662 is smoothed over time at step 668, which uses a previous mismatch (M2) 670 that is weighted using single or multiple weighting coefficients 666, to give a new time-smoothed SNR mismatch 674. Depending on the magnitude of this mismatch, various operating modes 678 can be invoked, for example, by user operating mode 672 or as described by the AGC decision module 676.

Figure 7:
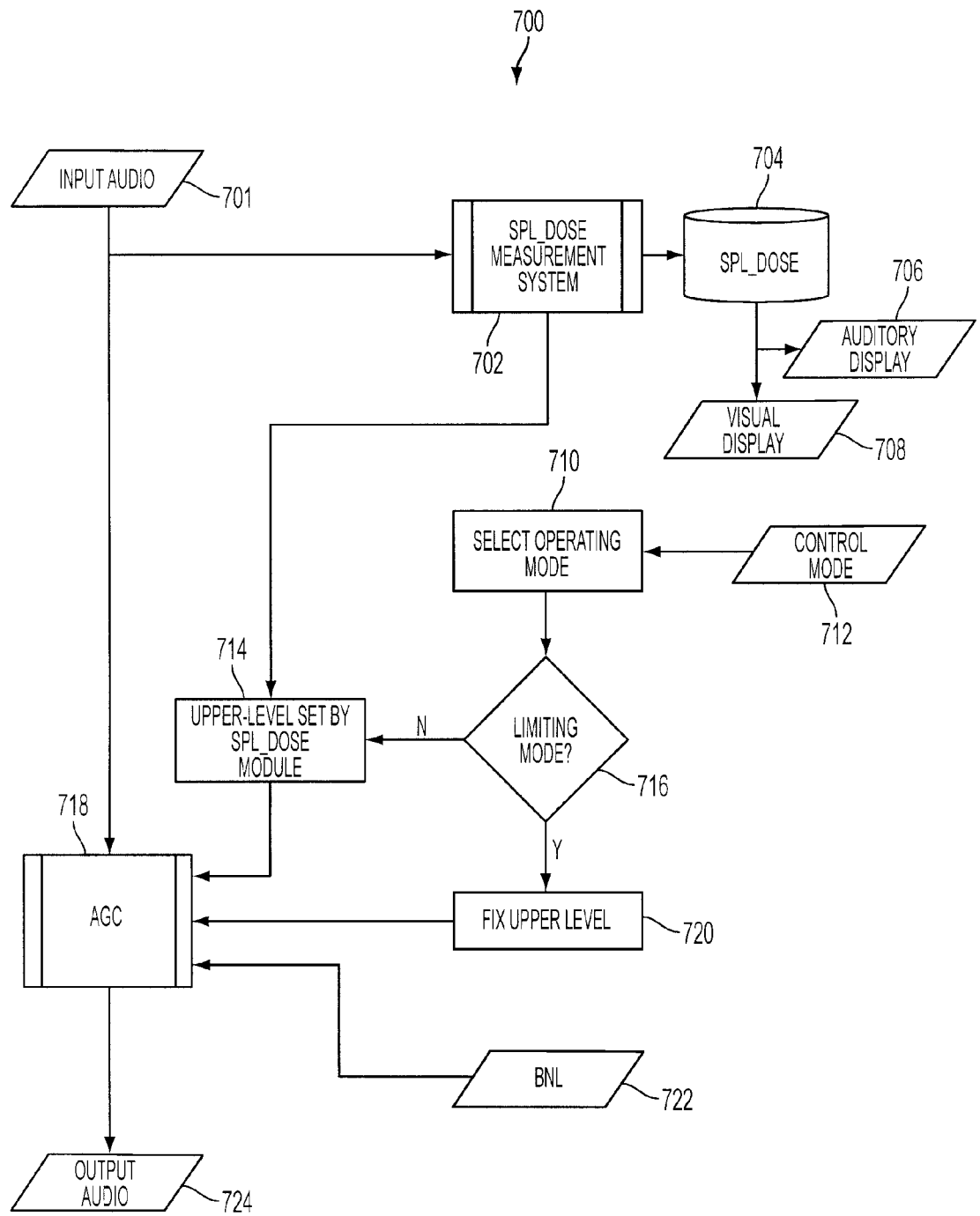
FIG. 7 is a flowchart of a method for safe level checking to monitor a total sound exposure of the listener in accordance with an exemplary embodiment.

FIG. 7 illustrates an exemplary embodiment of a "safe level checking" system 700 which includes a system 702 to monitor the total sound exposure of the listener (SPL_Dose measurement system). The safe level checking system 700 can receive input audio 701 from either the audio interface 212, ambient sound from the ASM 111, internal sound within the ear canal via the ECM 123, or sound produced from the ECR 125 and captured by the ECM 123.

The safe level checking system 700 can control the reproduction level of the ECR 125 signal when generating the output audio 724 to reduce the chance of permanent hearing damage to the user. The safe level checking system 700 can select compression curves (FIG. 8) (based on BNL 722) and/or automatic gain coefficients (AGC) 718 to adjust the input audio 701 to within safe listening output audio 724.

The SPL_Dose measurement system 702 keeps a record of the total sound exposure to the listener (measured or estimated at the eardrum). An SPL_Dose 704 is calculated, that is a percentage value of the running personal exposure dose (i.e. the dose is not reset every day, but carries on when the earphones are worn), where 100% corresponds to a maximum daily dose (e.g. according to OSHA recommendations) and a value greater than 100% indicates that the user may be at risk of permanent hearing damage.

The SPL_Dose value 704 is communicated to the user with either or both visual means 708 (e.g. a read-out of the dose on a display on a mobile communications device or Portable Media Player (PMP) screen) or with auditory means 706 (e.g. a voice message indicating the SPL_Dose, or a voice message or non-voice message indicating when the SPL_Dose is a particular value, e.g. 75% and 100%). In at least one exemplary embodiment, the SPL_Dose is converted to a time value indicating the total remaining time that the user can continue to listen to reproduced audio content at a given average SPL value (e.g. an SPL value approximately equal to the recent average SPL value generated by reproduced audio content). The user can be informed of this time value using either or both visual or/and sound means, as with the SPL_Dose.

In another exemplary embodiment, an operating mode 710 is selected either manually using interface means 712 (e.g. via a keypad entry on a PMP or mobile phone) or automatically, for instance with non-user changeable means depending on regional laws, to invoke a fixed maximum reproduction limit 720. This maximum limit may be a peak or RMS dB SPL value, approximating the SPL measured at the eardrum. When the "limiting mode" 716 is selected (i.e. either automatically or manually) then the AGC 718 that processes the input audio 701 (e.g. the mix of audio content from a media player and audio from the ASM and/or ECM) is updated so that the maximum peak or RMS value of audio reproduced with the ECR is equal to the predetermined maximum limit value. In another exemplary embodiment, when the limiting mode is not selected, the upper value of the AGC is set 714 by the SPL_Dose system 700, e.g. to allow the user to listen to audio content at a predetermined level for a predetermined length of time to reduce the likelihood of permanent hearing damage.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions of the relevant exemplary embodiments. Thus, the description of the invention is merely exemplary in nature and, thus, variations that do not depart from the gist of the invention are intended to be within the scope of the exemplary embodiments of the present invention. Such variations are not to be regarded as a departure from the spirit and scope of the present invention.

What is claimed is:

1. An earpiece comprising:
   an Ambient Sound Microphone (ASM) configured to measure a background noise level of an ambient sound;
   an Ear Canal Receiver (ECR) configured to deliver audio content to an ear canal; and
   a processor operatively coupled to the ASM and the ECR, where the processor is configured to:
   determine a residual background noise level within the ear canal based on at least one of the background noise level of the ambient sound or a measured ear canal background noise level within the ear canal,
   determine an ear canal signal to noise ratio (SNR) between an audio content level ACL of the audio content and the residual background noise level,
   determine a mismatch between the ear canal SNR and a target SNR, and
   adjust a gain applied to at least one of the audio content or the ambient sound based on the mismatch such that an approximately constant SNR ratio is maintained between the ACL and the residual background noise level within the ear canal.

2. The earpiece according to claim 1, wherein the processor subtracts one of an attenuation level and a noise reduction rating of the earpiece from an ambient sound level of the ambient sound to estimate the residual background noise level within the ear canal.

3. The earpiece according to claim 1, wherein the processor regulates a passing of the ambient sound measured from the ASM to the ECR to maintain the approximately constant SNR ratio.

4. The earpiece according to claim 3, wherein the processor adjusts an amplitude of at least one frequency of the audio content such that a sound produced within the ear canal conforms to a frequency spectrum of the ambient sound.

5. The earpiece according to claim 1, wherein the processor selects a compression based on an amplitude level and a frequency content of the residual background noise level.

6. The earpiece according to claim 5, wherein the processor adjusts sound levels in the ear canal to maintain the approximately constant SNR ratio using the compression.

7. The earpiece according to claim 1, further comprising an Ear Canal Microphone (ECM) configured to measure the ear canal background noise level within the ear canal.

8. The earpiece according to claim 7, wherein the processor upon detecting sound activity within the ear canal by the ECM, updates the residual background noise level to compensate for a sound level of the sound activity, wherein the sound activity includes at least one of a voice activity or an audio content activity from music.

* * * * *